United States Patent [19]

Matsuda

[11] Patent Number: 5,132,756
[45] Date of Patent: Jul. 21, 1992

[54] METHOD OF MANUFACTURING SEMICONDUCTOR DEVICES

[75] Inventor: Tetsuo Matsuda, Tokyo, Japan

[73] Assignee: Kabushiki Kaisha Toshiba, Kawasaki, Japan

[21] Appl. No.: 601,042

[22] Filed: Oct. 24, 1990

Related U.S. Application Data

[63] Continuation of Ser. No. 295,533, Jan. 11, 1989, abandoned.

[30] Foreign Application Priority Data

Jan. 14, 1988 [JP] Japan ................... 63-4878

[51] Int. Cl.5 ............... H01L 27/01; H01L 29/04; H01L 23/48
[52] U.S. Cl. .................. 357/23.1; 357/59; 357/71; 357/68
[58] Field of Search ............. 357/23.1, 59, 71, 68

[56] References Cited

U.S. PATENT DOCUMENTS

| 4,164,553 | 8/1979 | Perugini et al. | 423/440 |
| 4,263,058 | 4/1981 | Brown et al. | 357/71 |
| 4,356,623 | 11/1982 | Hunter | 437/44 |
| 4,429,011 | 1/1984 | Kim et al. | 148/33.5 |
| 4,445,266 | 5/1984 | Mai et al. | 437/41 |
| 4,502,209 | 3/1985 | Eizenberg et al. | 737/200 |
| 4,503,601 | 3/1985 | Chiao | 437/44 |
| 4,549,905 | 10/1985 | Yamaguchi et al. | 75/238 |
| 4,558,338 | 12/1985 | Sakata | 357/59 |
| 4,616,399 | 10/1986 | Ooka | 437/44 |

FOREIGN PATENT DOCUMENTS 0013075  1/1987  Japan ............... 357/23.1

OTHER PUBLICATIONS

Chow, T. P., et al., J. Appl. Phys. 52(10). Oct. 1981, pp. 6331–6336.
Kirk-Othmer Encyclopedia of Chemical Technology, John Wiley & Sons, 1978, vol. 4 pp. 476–505.

Primary Examiner—Mark Prenty
Attorney, Agent, or Firm—Oblon, Spivak, McClelland, Maier & Neustadt

[57] ABSTRACT

An improved method of manufacturing a semiconductor device wherein an insulating film, a conducting film, a first film to prevent conducting and refractory metal films from the reaction and a refractory metal film are sequentially deposited on a semiconductor substrate. Further, a second film is formed on the surface of the refractory metal film to prevent the exposed surface of the refractory metal film from the oxidization. Tungsten, molybdenum or the like is used as a refractory metal. A nitride film, a carbide film, or a silicide film of tungsten or molybdenum may be advantageously used as the second film.

7 Claims, 2 Drawing Sheets

METHOD OF MANUFACTURING SEMICONDUCTOR DEVICES

This application is a continuation of application Ser. No. 07/295,533, filed on Jan. 11, 1989, now abandoned.

BACKGROUND OF THE INVENTION

1. Field of the Invention

This invention relates to a method of manufacturing semiconductor devices, and more particularly to an improved method of forming electrodes and interconnections of semiconductor devices.

2. Description of the Prior Art

In general, the resistance values of electrodes and interconnections of semiconductor devices, particularly of MOS (metal-oxide-semiconductor) type transistors have significant effects upon their operating speeds, and also upon the degree of freedom in their design. Thus, these resistance values are required to be minimized. For this reason, various techniques have been disclosed in which a refractory metal (having a high melting point and a relatively low specific resistance) is used to form the gate electrodes and interconnections. When a refractory metal is deposited on a polycrystalline silicon film in a MOS-type transistor, the work function of the gate at the MOS capacitor portion is substantially the same as that in the case of the conventional polycrystalline silicon gate. In other words, the work function of the gate is changed when the refractory metal film alone is used as a single-layer structure gate. Thus, the structure that the refractory metal film is laminated on the polycrystalline silicon film is advantageous more than the single-layer structure of the refractory metal.

However, the process of manufacturing MOS-type semiconductor devices generally includes several high temperature processes. Specifically, the manufacturing process requires a post oxidization process (later described in detail) of about 700° C. to 800° C. and an inter-layer film leveling process of about 700° C. to 850° C., for example. These temperatures are well over the temperature at which the refractory metal combines with silicon in a polycrystalline silicon film. (e.g. 550° C. to 600° C. for tungsten). To avoid such chemical reaction between the polycrystalline silicon film and the refractory metal film, a metal nitride film or a metal carbide film is interposed therebetween to prevent conducting and refractory metal films from the reaction.

The post oxidization process is performed to recover defects and damage to the substrate, which are induced during etching or ion implantation. The post oxidization process is also intended to enhance the gate characteristics of a MOS capacitor and a MOS-type transistor. However, the refractory metal film is easily oxidized in the post oxidization process. Particularly in an atmosphere of oxygen at about 900° C. (ordinary oxidization condition for a polycrystalline silicon film), or in an atmosphere of $O_2$-$H_2O$ at about 800° C., the refractory metal film is significantly oxidized. As a result, the resistance values of the gate electrode and interconnections, which are made of refractory metal, inevitably increase.

To prevent such an increase of the resistance values of the electrodes and interconnections, it is necessary to oxidize only the silicon film, while the refractory film is not oxidized. This can be achieved if the oxidization process is performed in an atmosphere of hydrogen containing steam of a few percent at about 900° C. However, such oxidization process requires hydrogen of high concentration at a high temperature. This process is sometimes accompanied with a danger of explosion. Moreover, the oxidization rate of the polycrystalline silicon film is very slow in the process. As a result, the necessary oxidization of the polycrystalline silicon film inevitably requires a long-time processing. This has been a restriction in manufacturing MOS-type transistors.

SUMMARY OF THE INVENTION

Accordingly, one object of this invention is to provide an improved method of manufacturing semiconductor devices. The method can suppress oxidization of refractory metal films used as electrodes and interconnections.

Briefly, in accordance with one aspect of this invention, there is provided a method of manufacturing semiconductor devices which comprises the steps of forming a conducting film on a semiconductor substrate through an insulating layer, forming a first film on the conducting film to prevent conducting and refractory metal films from the reaction, forming a refractory metal film on the first film, forming an second film on the exposed surface of the refractory metal film to prevent the exposed surface of the refractory metal film from the oxidization, and exposing the semiconductor substrate to an oxidation atmosphere.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
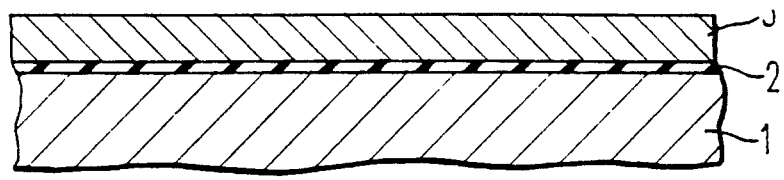
FIGS. 1a through 1d are cross-sectional views illustrating manufacturing processes according to one embodiment of the present invention.

Referring now to the drawings, wherein like reference numerals designate identical or corresponding parts throughout the several views, and more particularly to FIGS. 1a through 1d thereof, one embodiment of this invention will be described.

Figure 1B:
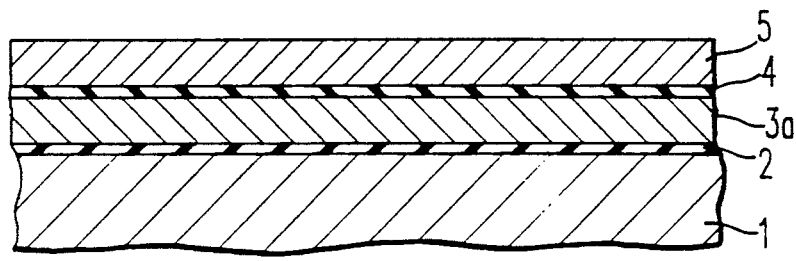

In FIG. 1a, a silicon oxide film 2 of about 12 nm thick is formed on a semiconductor (silicon) substrate 1 as a gate insulating film. Next, a polycrystalline silicon film 3 of about 200 nm is formed on the silicon oxide film 2 by use of CVD (chemical vapor deposition) or the like. Thereafter, the substrate 1 is exposed to an atmosphere of phosphorus oxychloride at 950° C. for a time between about 20 to 30 minutes. This causes phosphorus (P) to be introduced into the polycrystalline silicon film 3. Thus, a phosphorusdoped polycrystalline silicon film 3a is formed as a first conducting film as shown in FIG. 1b.

Further, a titanium nitride (TiN) film 4 of about 20 nm is formed by use of a reactive sputtering technique on the phosphorus-doped polycrystalline silicon film 3a as a first film to prevent conducting and refractory metal films from the reaction. Next, a refractory metal film, such as a tungsten (W) film 5 of about 200 nm thick is formed by use of a sputtering technique on the titanium nitride film 4 as a second conducting film. The titanium nitride film 4 may also be formed by use of a CVD (chemical vapor deposition) technique other than the reactive sputtering technique. The tungsten film 5 may also be formed by use of a CVD technique other than the sputtering technique.

Figure 1C:
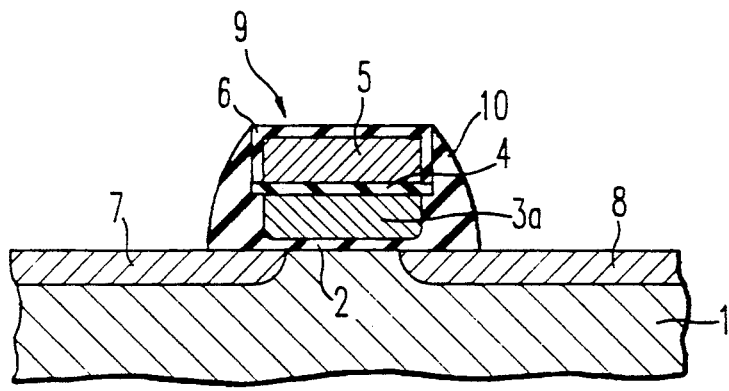
Figure 1D:
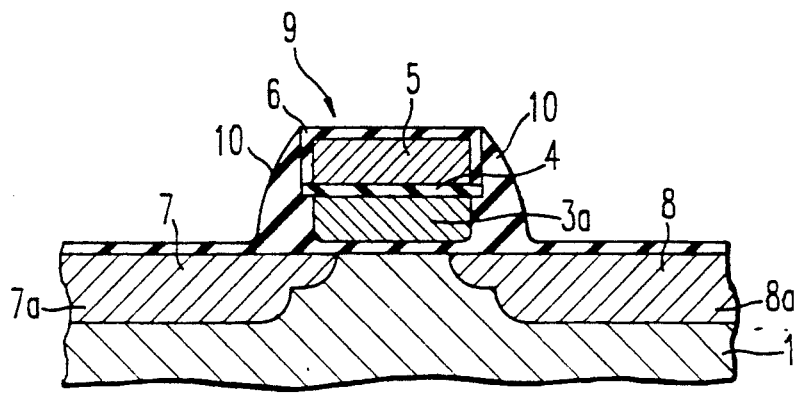

Thereafter, the tungsten film 5, the titanium nitride film 4, the phosphorus-doped polycrystalline silicon film 3a and the silicon oxide film 2 are eliminated leaving a portion that constitutes a gate electrode 9 by use of photographic etching, reactive etching or the like, as shown in FIG. 1c. Next, the substrate 1 is exposed to an atmosphere of ammonia at 600° C. for 30 minutes, and is given a thermal process (to be combined with nitrogen). As a result, a tungsten nitride film 6 of about 10 nm is formed on the surface of the tungsten film 5. The tungsten nitride film 6 serves as a second film to prevent the exposed surface of the refractory metal film from the oxidization. Next, an n$^-$-type source region 7 and an n$^-$-type drain region 8 are formed by phosphorus ion implantation and diffusion. Further, a sidewall 10, which is an insulating film of silicon oxide, is formed on the sidewall of the gate electrode 9.

Next, arsenic (As) ion implantation is effected to portions deeper than the source and drain regions 7 and 8 using the sidewall 10 as a mask. Thereafter, the arsenic is diffused so as to form an n$^+$-type source region 7a and an n$^+$-type drain region 8a. Further, an insulating film (not shown) is formed on the entire surface. Then, metal films (not shown), which are connected to the source and drain regions 7 and 8 and the gate electrode 9, are formed.

Thereafter, the substrate 1 is exposed to an atmosphere of hydrogen at about 800° C. for about 60 minutes, and a hydrogen-combustive oxidation process takes place therein. The purpose of this process is to eliminate defects and damage in the source and drain diffusion regions 7, 7a, 8 and 8a. This process is also intended to improve the gate characteristics of the device. Specifically, the defects and damage to the substrate surface, which are induced during the ion implantation process forming diffusion layers or the etching process to forming the prescribed surface, are repaired with the post oxidization process. In addition, the angular corners of the gate electrode are rounded by virtue of this oxidization process. Thus, an electric field concentration generated in the vicinity of such angular corners can be avoided. Even when the post oxidization process is performed, the tungsten nitride film 6 serves to protect the surface of the refractory metal film 5 from being oxidized.

Therefore, the resistance values of the gate electrodes and interconnections of a MOS-type transistor manufactured by the above-described process are not increased. Moreover, in accordance with this embodiment, the silicon region can be oxidized alone without causing the refractory metal film 5 to be oxidized. Thus, the degree of freedom in the process of forming the gate electrode and interconnections of refractory metal can be significantly improved.

Figure 2A:
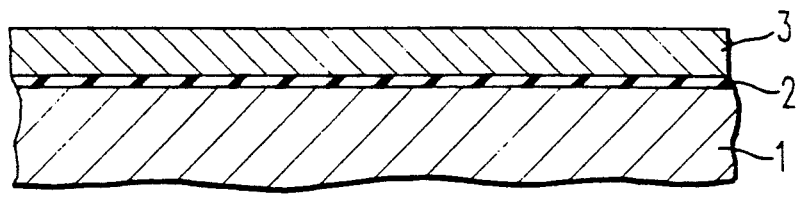
FIGS. 2a through 2e are cross-sectional views illustrating manufacturing processes according to another embodiment of the present invention.
Figure 2B:
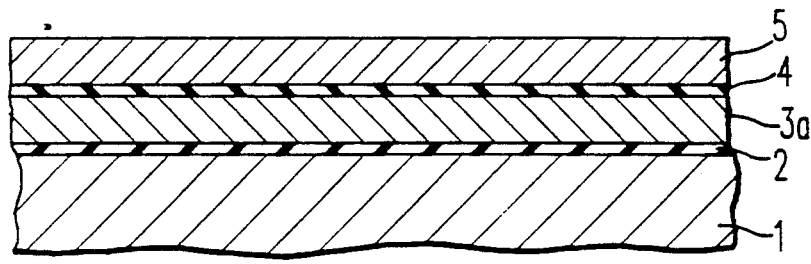

Next, a second embodiment according to the present invention will be described with reference to FIGS. 2a through 2e. Processes of FIGS. 2a and 2b are the same as in FIGS. 1a through 1b. Thus, the description thereof will be omitted. As shown in FIG. 2b, a silicon oxide film 2, a phosphorus-doped polycrystalline silicon film 3a, a titanium nitride film 4 and a tungsten film 5 are sequentially deposited on a semiconductor substrate 1.

Figure 2C:
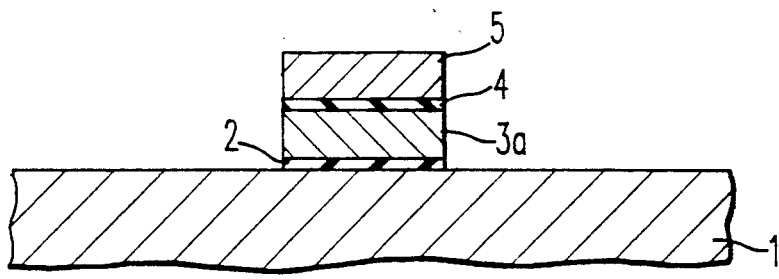

Next, the deposited films are eliminated leaving prescribed portions so as to form required patterns, as shown in FIG. 2c.

Figure 2D:
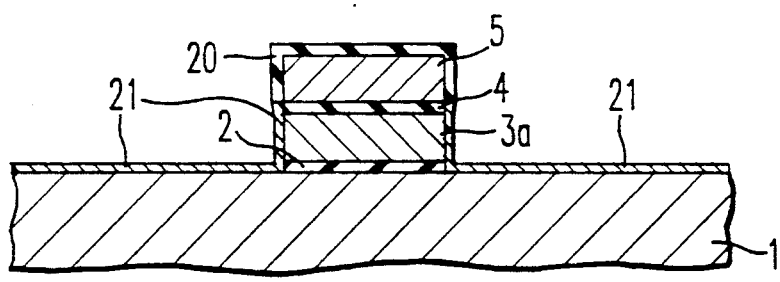

Thereafter, a polycrystalline silicon film 21 of about 20 nm thick is formed on the entire surface by a chemical vapor deposition technique, as shown in FIG. 2d. Further, the substrate 1 is exposed to an atmosphere of nitrogen at 800° C. for 30 minutes. Thus, the substrate 1 undergoes a specified thermal process. As a result, a tungsten silicide film 20 is formed on the surface of the tungsten film 5 on which the patterns were previously formed. The tungsten silicide film 20 serves as a second film to prevent the exposed surface of the refractory metal film from the oxidization. Here, the polycrystalline silicon film 21 remains on the sidewalls of the substrate 1 and the phosphorus-doped polycrystalline silicon film 3a.

Figure 2E:
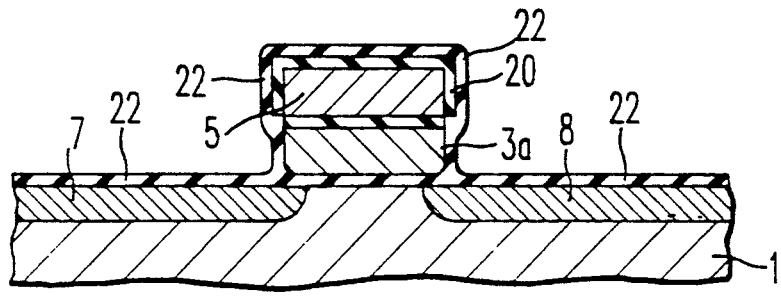

Next, a source region 17 and a drain region 18 are formed in the same manner as in the first embodiment. Thereafter, the substrate 1 is given a hydrogen-combustive oxidation process at 900° C. for 60 minutes. The purpose of this process is to eliminate defects and damage in the source and drain regions 17 and 18 which are induced during etching or ion implantation. The process is also intended to improve the gate characteristics of the device. As a result, the polycrystalline silicon film 21 remains as an oxide film 22, as shown in FIG. 2e. In this case, the tungsten film 5 is not oxidized because the tungsten silicide film 20, which serves to prevent the oxidization, was previously formed on the surface thereof.

The thus the manufactured MOS-type transistor has the same advantages as those in the first embodiment.

In the first and second embodiments, a MOS-type transistor having an LDD (lightly doped drain and source) structure has been described as an example. However, this invention is not limited to this, but may also be applied to any other MOS-type transistors, or any transistors using refractory metals.

Further, the refractory metal described in the embodiments of this invention is not limited to tungsten but may also be molybudenum. Specifically, this invention is advantageous with any refractory metals which are used for electrodes and interconnections of semiconductor devices, and are inevitably oxidized during the necessary oxidization processes in manufacturing the semiconductor devices.

As described above, according to the present invention, a refractory metal film is combined with nitrogen, carbon or silicon. As a result, the surface of the refractory metal is coated with a nitride film, carbide film or silicide film. Thus, the refractory metal is not oxidized even when the substrate is exposed to an atmosphere of plasma oxygen or an atmosphere of dry oxygen for the oxidization process. Therefore, the resistance value of the surface of the refractory metal film remains substantially unchanged. Moreover, the material of the second film to prvent the exposed surface of the refractory metal film from the oxidization is not limited to the above-described TiN, but other metallic compounds such as TiC, TiCN, WN, WC, WCN, H$_x$N, H$_x$C, H$_x$CN, CrC, ZrN and ZrCN may be used.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor substrate having source and drain regions;
   an insulating gate film formed on said substrate;
   a conducting film formed on said insulating film and having convex rounded areas at least corresponding to the corners of said source and drain regions;
   a reaction-resistant film formed on said conducting film;
   a refractory metal film formed on said reaction-resistant film;
   an oxidation-resistant film formed on said refractory metal film; and
   an oxide film formed on said substrate surrounding at least said conducting film.

2. The semiconductor device of claim 1, wherein said substrate is silicon and said conducting film is polycrystalline silicon.

3. The semiconductor device of claim 1, wherein said reaction-resistant film is a metal nitride film.

4. The semiconductor device of claim 1, wherein said reaction-resistant film is a metal carbide film.

5. The semiconductor device of claim 1, wherein said oxidation-resistant film is a metal nitride carbide film 7.

6. The semiconductor device of claim 1, wherein said oxidization-resistant film is a refractory metal nitride film.

7. The semiconductor device of claim 1, wherein said oxidization-resistant film is a refractory metal silicide film.

* * * * *